United States Patent [19]

Iguchi et al.

[11] 4,234,813

[45] Nov. 18, 1980

[54] PIEZOELECTRIC OR PYROELECTRIC POLYMER INPUT ELEMENT FOR USE AS A TRANSDUCER IN KEYBOARDS

[75] Inventors: Heishaburo Iguchi, Kamakura; Hiroji Ohigashi, Zushi, both of Japan

[73] Assignee: Toray Industries, Inc., Tokyo, Japan

[21] Appl. No.: 28,822

[22] Filed: Apr. 10, 1979

[30] Foreign Application Priority Data

Apr. 10, 1978 [JP] Japan .................................. 53/41981

[51] Int. Cl.³ ...................... H01L 41/08; H01L 41/18
[52] U.S. Cl. .................................. 310/366; 310/339; 310/800; 340/365 A
[58] Field of Search ............... 310/338, 339, 800, 366; 340/365 A

[56] References Cited

U.S. PATENT DOCUMENTS

| | | | |
|---|---|---|---|
| 3,648,279 | 3/1972 | Watson | 310/339 |
| 3,699,294 | 10/1972 | Sudduth | 340/365 A X |
| 3,931,446 | 1/1976 | Murayama | 310/800 |
| 3,935,485 | 1/1976 | Yoshida et al. | 310/339 |
| 3,940,637 | 2/1976 | Ohigashi et al. | 310/339 |

FOREIGN PATENT DOCUMENTS

2805332  8/1978  Fed. Rep. of Germany .......... 310/339

*Primary Examiner*—Mark O. Budd
*Attorney, Agent, or Firm*—Armstrong, Nikaido, Marmelstein & Kubovcik

[57] ABSTRACT

An input element for use as a transducer in keyboards is disclosed, which utilizes a polymeric material having piezoelectric or pyroelectric property as a stimulus-receiving portion of the element. The element has a plurality of stimulus-receiving portions. One face of each of stimulus-receiving portions has mutually independent electrodes, of which one is for detecting signal and another is for earthing, and another face of each stimulus-receiving portions has mutually independent electrodes, of which one is for detecting signal and another is for earthing. The signal-detecting electrode on the one face is disposed corresponding to the earthing electrode on the another face.

7 Claims, 17 Drawing Figures

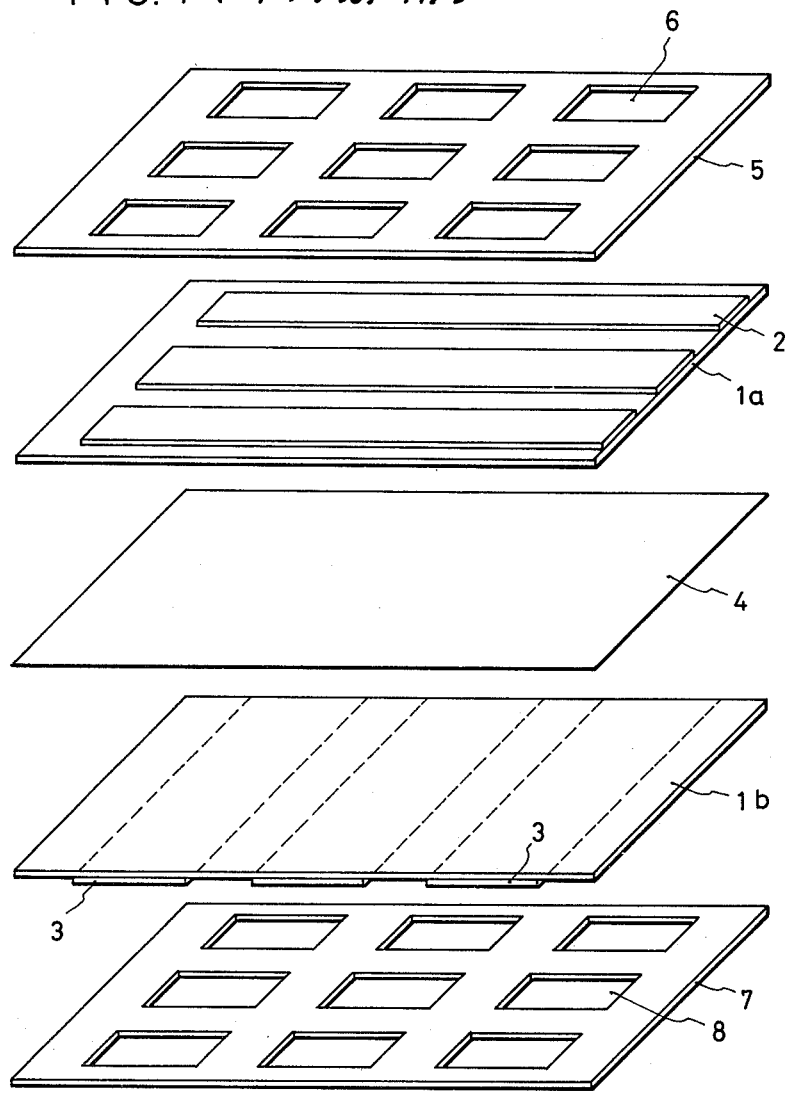
FIG. 1(a) *Prior Art*
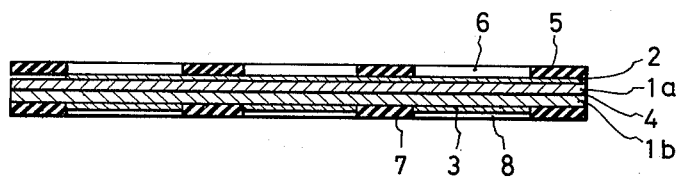
FIG.1(b) *Prior Art*

FIG. 2 (a) *Prior Art*
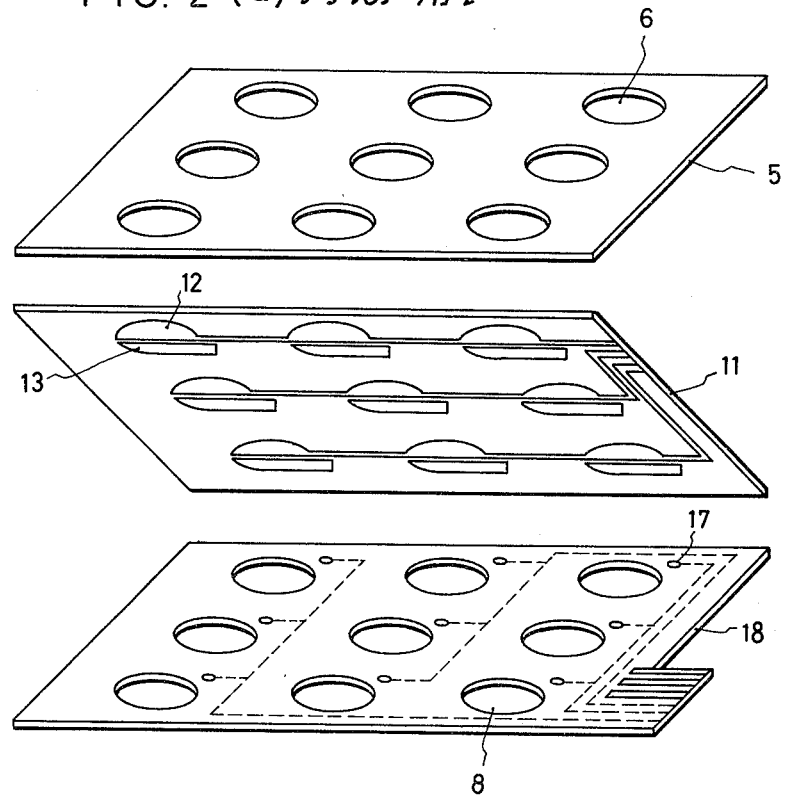
FIG. 2 (b) *Prior Art*
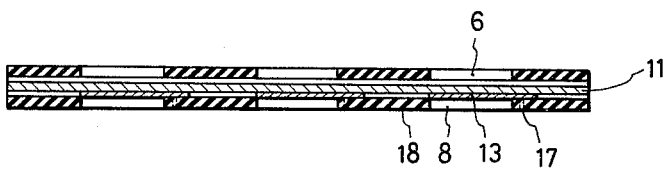

FIG. 3(a) *Prior Art*
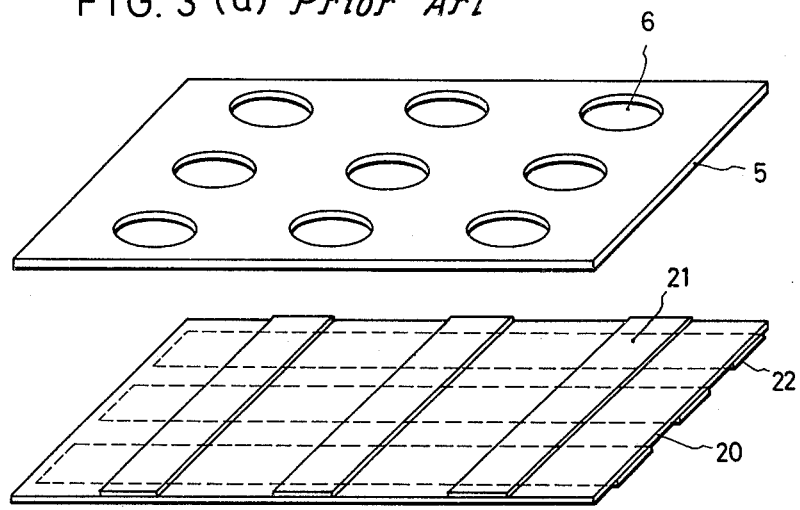
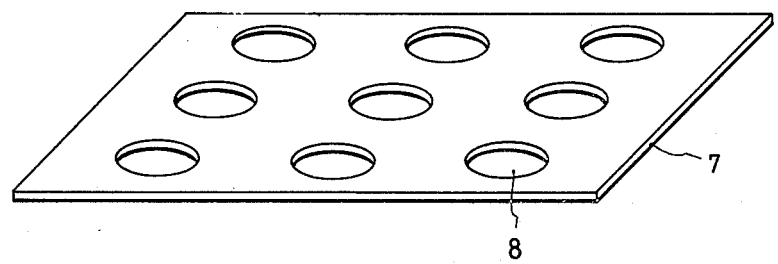
FIG. 3(b) *Prior Art*
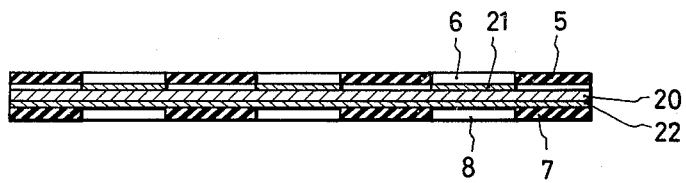

PIEZOELECTRIC OR PYROELECTRIC POLYMER INPUT ELEMENT FOR USE AS A TRANSDUCER IN KEYBOARDS

BACKGROUND OF THE INVENTION

The present invention relates to an input element for use as a transducer in keyboard composed of a piezoelectric material, preferably a sheet-like polymeric piezoelectric material.

Piezoelectric materials are divided into two types, namely inorganic materials such as barium titanate or quartz and polymeric materials. The piezoelectric materials of the latter type are excellent in the shock resistance and water resistance and are advantageous over the piezoelectric materials of the former type in that sheets having a large area and being uniform in the piezoelectric characteristics can easily be obtained. Accordingly, by utilizing these advantageous characteristics, a keyboard having a high reliability can be obtained by a low cost by forming a plurality of stimulus-receiving portions such as pressure-sensitive portions (input portions and detecting portions) on one sheet composed of a polymeric piezoelectric material.

As means for detecting mechanical stimula imposed on a piezoelectric sheet composed of a polymeric piezoelectric material in the form of electric signals, there have heretofore been proposed the following three methods.

The first method uses two piezoelectric films. More specifically, as illustrated in FIG. 1, on opposite surfaces of two piezoelectric films 1a and 1b there are disposed electrodes 2 as the X-coordinate signal and electrodes 3 as the Y-coordinate signal, respectively, and the two films 1a and 1b are piled with a sheet-like earthing electrode 4 being interposed therebetween so that the electrodes 2 and 3 intersect each other at a right angle, and plastic plates 5 and 7 having key holes 6 and 8 formed thereon are laminated on the above assembly. According to this conventional technique, since two piezoelectric films are piled, the flexibility inherent of the polymeric piezoelectric material is lost and there is produced a considerable difference of the output level between the upper and lower piezoelectric films. There are observed such defects as reduction of the magnitude of the output signal and indispensable increase of the amount used of the piezoelectric material.

According to the second conventional method, as shown in FIG. 2, electrodes 12 and 13 for detection in the X-direction and the Y-direction are formed in regions corresponding to the respective coordinates (keys) on one piezoelectric film 11, and one electrode 13 is connected to a Y-direction conduction circuit through a through hole 17 piercing a substrate 18 of the piezoelectric film. In this method, however, electric connection of the electrode 13 on the piezoelectric film 11 with the through hole 17 of the substrate 18 is very difficult, and the reliability of this connection is very low. Furthermore, an excessive area is necessary for the through hole 17 and, therefore, this method is defective in that the area density of coordinates or keys cannot be sufficiently increased.

According to the third conventional method, as shown in FIG. 3, electrodes 21 and 22 for the X-direction and the Y-direction are formed on the upper and lower surfaces of a piezoelectric film 20, respectively, and signals of respective coordinates or keys are detected by the dynamic drive system. In this conventional method, however, since no complete earthing is attainable, when a stimulus is given to a certain coordinate point, other undesirable output signals appear on other coordinate points through capacitive coupling, that is so-called cross-talk occurs. The maximum magnitude of this cross-talk is as high as $\frac{1}{2}$ of the magnitude of the desired signal output from the coordinate point given the stimulus positively. Therefore, the S/N ratio of the desired signal is low. This is a fatal defect to a coordinate input device or keyboard, and the product according to this conventional method cannot be put into practical use.

SUMMARY OF THE INVENTION

It is a primary object of the present invention to provide an input element for use as a transducer in keyboard in which the foregoing defects of the conventional techniques are eliminated, particularly an input element which has such a structure that various characteristics of a polymeric piezoelectric material can be effectively utilized and in which through holes need not be formed and good output signals free of cross-talk can be provided.

In accordance with the present invention, this and other objects can be attained by an input element comprising a great number of stimulus-receiving portions composed of a piezoelectric or pyroelectric material and receiving a stimulus by an operation, each stimulus-receiving portion including independent electrodes that are a first signal-detecting electrode (A1) and a front-face earthing electrode (B1) formed on one surface of said stimulus-receiving portion and independent electrodes that are a back-face earthing electrode (A2) and a second signal-detecting electrode (B2) corresponding to said electrodes A1 and B1, respectively, which are formed on the other surface of the stimulus-receiving portion, wherein said stimulus-receiving portions are arranged in rows, the electrodes A1 of the respective rows are connected to one another, the electrodes A2 of the respective rows are connected so that an earthing electrode is formed, the electrodes B1 of the respective rows are connected so that an earthing electrode is formed and the electrodes B2 of the respective rows are connected to one another.

BRIEF DESCRIPTION OF THE DRAWINGS

FIGS. 1-(a) and 1-(b), FIGS. 2-(a) and 2-(b) and FIGS. 3-(a) and 3-(b) are perspective views showing the conventional coordinate input devices and diagrams illustrating the assembly state thereof, respectively.

DETAILED DESCRIPTION OF THE PREFERRED EMBODIMENTS OF THE INVENTION

The present invention will now be described in detail by reference to FIGS. 4 to 10 of the accompanying drawing.

Figure 4A:
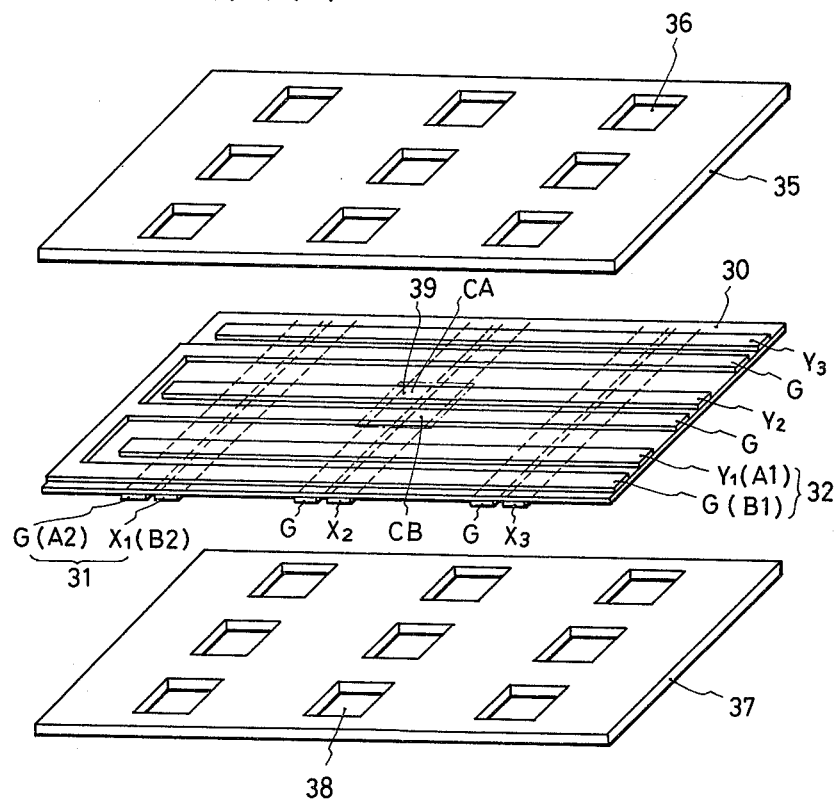
FIG. 4-(a) is a fragmentary perspective view showing one embodiment of the input element according to the present invention, and FIG. 4-(b) is a diagram illustrating the assembly state thereof.
Figure 4B:
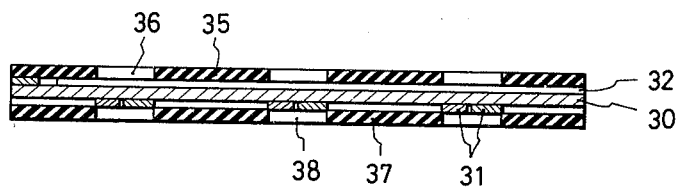

FIG. 4 illustrates an embodiment of the input element according to the present invention, in which (a) is a fragmentary perspective view and (b) is a view illustrating diagrammatically the assembly state. As is seen from FIG. 4, the input element of the present invention comprises a polymeric film 30 composed of a polymeric material and supporting plates 35 and 37 having key holes 36 and 38, respectively. The polymeric film 30 is piezoelectric at least in stimulus-receiving portions 39 corresponding to the key holes 36 and 38 of the supporting plates 35 and 37. Electrodes $X_1$, $X_2$, $X_3$, ... for detecting signals in the direction X are formed on the lower surface of the polymeric film 30, and electrodes $Y_1$, $Y_2$, $Y_3$, ... for detecting signals in the direction Y are formed on the upper surface of the polymeric film 30, so that both the groups of the electrodes intersect one another at a right angle in the coordinate input portions or key input portions corresponding to the key holes 36 and 38. One earthing electrode G is arranged in parallel to each of the rows of the signal-detecting electrodes $X_1$, $X_2$, $X_3$, ... and $Y_1$, $Y_2$, $Y_3$, ..., and these earthing electrodes G intersect one another at a right angle in the coordinate input or key input portions. Accordingly, one pair 31 of electrodes in the direction X are constructed by one of the signal-detecting electrodes $X_1$, $X_2$, $X_3$, ... in the direction X and one earthing electrode G, and another pair 32 of electrodes in the direction Y are constructed by one of the signal-detecting electrodes $Y_1$, $Y_2$, $Y_3$, ... in the direction Y and one earthing electrode G. These electrode pairs 31 and 32 intersect each other at a right angle in each coordinate input or key input portion. Accordingly, the signal-detecting electrodes $Y_1$, $Y_2$, $Y_3$, ... and the earthing electrodes G one one surface, for example, on the upper face in FIG. 4, intersect the earthing electrodes G and the signal-detecting electrodes $X_1$, $X_2$, $X_3$, ... on the opposite surface (on the lower surface in the embodiment shown in FIG. 4) at a right angle.

In the above-mentioned structure, signals generated between the second signal-detecting electrodes $X_1$, $X_2$, $X_3$, ... (B2) on the lower surface and the front-face earthing electrodes G (B1) on the upper surface can be taken out as output signals in the direction X, and signals generated between the first signal-detecting electrodes $Y_1$, $Y_2$, $Y_3$, ... (A1) on the upper surface and the back-face earthing electrodes G (A2) on the lower surface can be taken out at output signals in the direction Y. However, no voltage is generated between every two to the earthing electrodes G.

In the above-mentioned embodiment of the present invention, since electrode pairs 31 and 32 are constructed by the signal-detecting electrodes $X_1$, $X_2$, $X_3$, ... and parallel earthing electrodes G and by the signal-detecting electrodes $Y_1$, $Y_2$, $Y_3$, ... and parallel earthing electrodes G, these earthing electrodes G perform a function of preventing occurrence of cross-talk, and even if a voltage causing cross-talk is generated in a portion other than the hammered desirable coordinate point, this voltage is earthed through the earthing electrode G, and cross-talk, which is caused by insufficient earthing in the conventional technique as described above with respect to FIG. 3, is not caused at all in the present invention not only theoretically but also actually.

In the input element of the present invention, the area of the polymeric film for one coordinate or key can be increased freely without limitation so far as practically required, and also, this area can be diminished to about 1 mm$^2$. Therefore, according to the present invention, there can be provided an input element having a very high resolving power or a piezoelectric keyboard including many keys, if desired. Moreover, lead-in wires for the respective coordinates or keys need not be independently formed, and if electrodes formed on the upper surface and electrodes formed on the lower surface to intersect the electrodes on the upper surface substantially at a right angle are connected to an electric signal processing portion in the peripheral area of the polymeric film, the intended electric connection can be accomplished. Therefore, the structure can be remarkably simplified, the reliability can be enhanced, and the manufacturing cost can be reduced. Moreover, the method for processing electric signals is not limited to the dynamic drive method, and the cost of electric circuits can be reduced.

Any of piezoelectric materials can be used in the present invention, but a polymeric piezoelectric material is most preferred because the output wave form is very simple, the manufacturing process can be facilitated and the mechanical strength is high. As the polymeric piezoelectric material, there can be mentioned (1) a uniaxially stretched polymer having an optical activity, for example, poly-γ-methyl-L-glutamate, which is a polyamino acid, (2) a polar polymer, such as polyvinylidene fluoride, polyacrylonitrile or polyvinyl fluoride, which has been subjected to a poling treatment under a high electric field, and (3) a product obtained by blending ferroelectric fine particles into as high polymer and subjecting the resulting compound to a poling treatment, for example, a product obtained by blending PZT powder into polyvinylidene fluoride or polysilicone and subjecting the resulting compound to a poling treatment.

When the polymeric piezoelectric material (1) is used, dynamic stimula causing elongation and contraction in parallel to the film surface should be applied so as to generate electric signals. However, when the polymeric piezoelectric material (2) or (3) is employed, any of dynamic stimula causing elongation and contraction in the direction parallel to the film surface, in the direction vertical to the film surface or in both the directions may be applied.

In the polymeric piezoelectric material (1), the piezoelectric characteristic is given by stretching, but in the polymeric piezoelectric materials (2) and (3), the piezoelectric characteristic is given by poling treatment. Accordingly, in the case of the material (2) or (3), output signals having a high S/N ratio can be taken out by disposing necessary electrodes on the film and selectively poling treatment only at the coordinate input or key input portions, that is, portions where dynamic stimula are to be applied, or by poling treatment the entire surface of the polymeric film to render it entirely piezoelectric and thermally depolarizing the area other than the coordinate input portions to render said area non-piezoelectric.

The present invention will now be described by reference to the following Examples.

EXAMPLE 1

Figure 5:
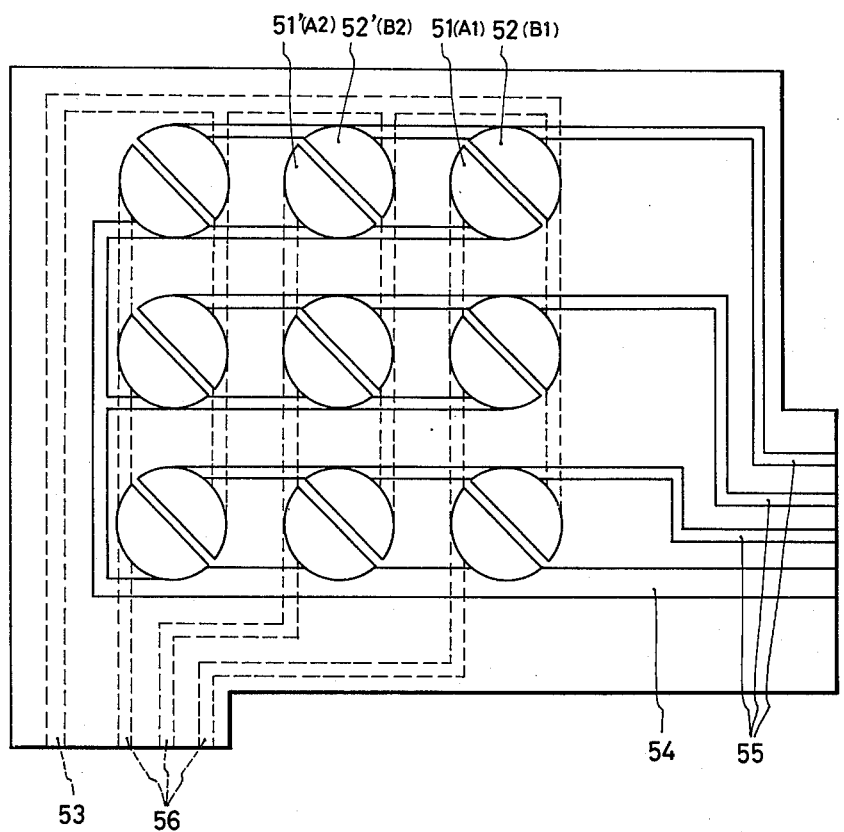
FIGS. 5-(a), 5-(b) and 5-(c) are fragmentary perspective views and assembly diagrams illustrating other embodiment of the input element according to the present invention.
Figure 5B:
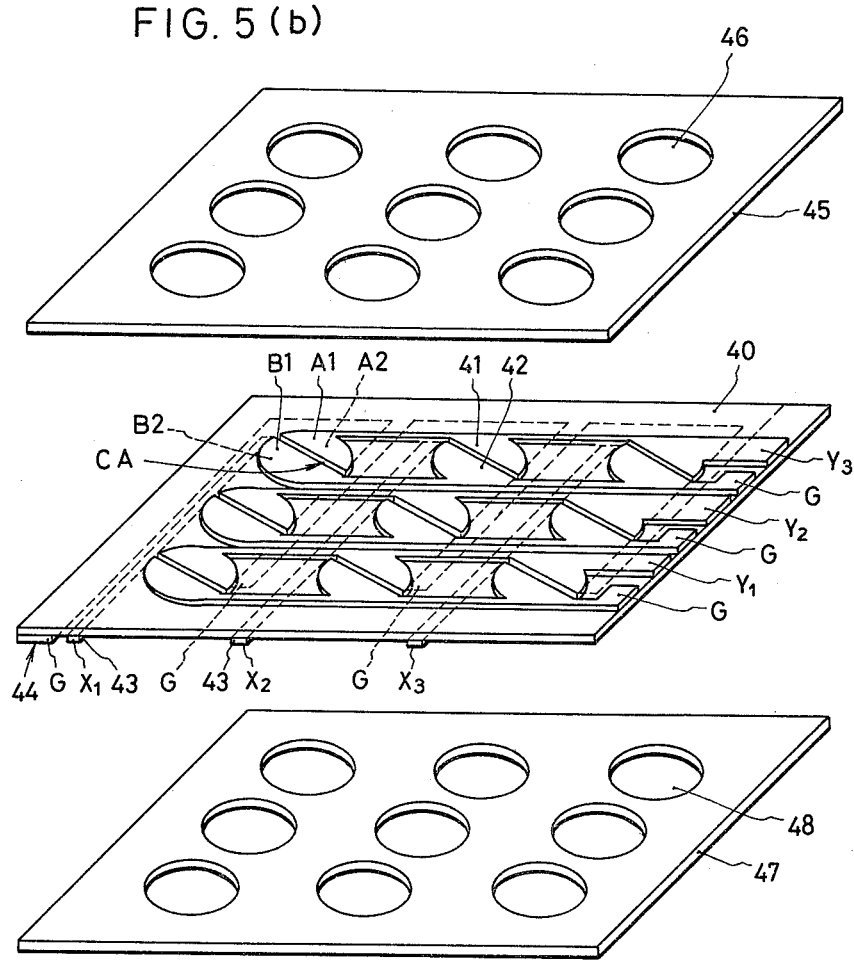
Figure 5C:
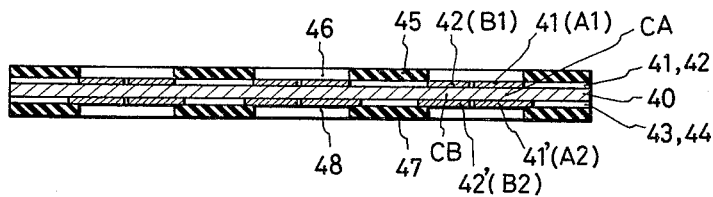

A pattern as shown in FIG. 5-(a) is screen-printed with electrically conductive silver paste on both the upper and lower surfaces of an entirely poled, biaxially stretched polyvinylidene fluoride film having a thickness of 50 μm, so that conduction circuits 54 and 55 on the upper surface intersect conduction circuits 53 and 56 on the lower surface at a right angle. In the drawing, input portions of 3×3 are shown for simplification of the illustration. The pattern indicated by dotted lines in the drawing is a pattern on the lower surface. Reference numerals 51 (A1) and 52 (B1) represent electrodes on the upper surface, and referential numeral 51' (A2) and 52' (B2) represent electrodes on the lower surface.

As shown in FIG. 5-(b), this piezoelectric film is bonded by an adhesive to a supporting plate 47 having holes 48 having a size substantially equal to the size of the electrode portions, which are formed on the portions corresponding to pairs of electrodes 41 and 42, and conduction wires of signal-detecting electrodes $X_1$, $X_2$, $X_3$, ... in the direction X and signal-detecting electrodes $Y_1$, $Y_2$, $Y_3$, ... in the direction Y and earthing wires of earthing electrodes G are taken out from the peripheral portion of the piezoelectric film 40, and they are used as input terminals for amplifier circuits. A coordinate position-indicating and protecting plastic plate 45 having key holes 46 corresponding to the portions of pairs of the electrodes 41 and 42 is bonded to the upper surface of the piezoelectric film 40 to form a laminate structure shown in FIG. 5-(c).

Figure 6:
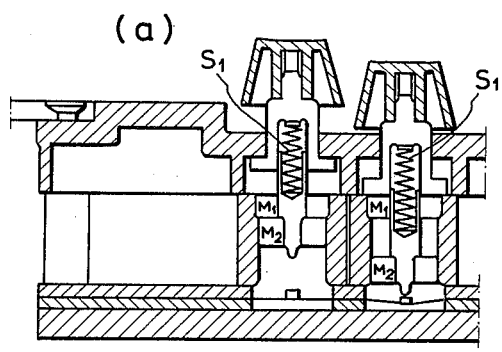
FIGS. 6-(a) and 6-(b) are diagrams illlustrating instances of the hammering mechanism that can be used in the present invention.
Figure 6:
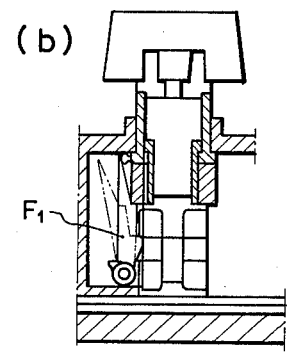

When a 10-line 10-row matrix type keyboard having the above-mentioned structure is actuated by a hammering mechanism comprising magnets $M_1$ and $M_2$ and a spring $S_1$ as shown in FIG. 6-(a) or comprising a spring and a hook $F_1$ as shown in FIG. 6-(b), for example, when the portion between the electrodes 41 and 42 in FIG. 5-(b) is hammered, an open voltage of +4 V is generated between the electrodes $Y_3$ and G and an open voltage of −4 V is generated between the electrodes $X_2$ and G. When these voltages are applied to the amplifier circuit, input voltages of +1.5 V and −1.5 V are observed at the electrodes $Y_3$ and $X_2$, respectively. The open voltages put out from the electrodes corresponding to other coordinates are within the range of ±200 mV, and they are mainly noises due to vibrations of the supporting plate.

EXAMPLE 2

In Example 1, the polarity of output signal from the signal-detecting electrodes in the direction X is reverse to the polarity of output signal from the signal-detecting electrodes in the direction Y. Processing of signals of reverse polarities generated in such structure is disadvantageous in that positive and negative power sources are necessary. Further, in case of a film which has been rendered piezoelectric uniformly, noises are readily generated by vibrations of the supporting plate or the like. These disadvantages can be eliminated by rendering localizing the portions having piezoelectric property at the necessary portions for occuring signals or by performing poling so that output signals in both the directions X and Y have the same polarity. This feature is illustrated in this Example.

Figure 7:
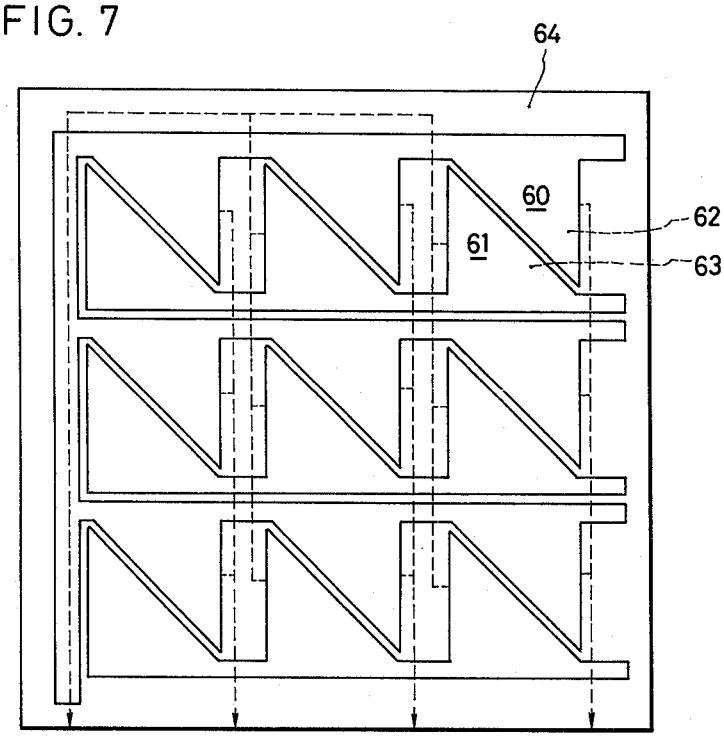
FIG. 7 is a plan view showing another embodiment of the polymeric film that is used in the present invention.

Electrode patterns (only coordinates of 3×3=9 are illustrated for the sake of simplification) are printed on both the upper and lower surfaces of a biaxially stretched PVDF film 64 having a thickness not exceeding 50 μm as shown in FIG. 7, and while applying voltages of reverse polarities between electrodes 61 and 63 and between 60 and 62, respectively, poling of the film 64 is performed, whereby the electrodes 61 and 62 are formed into positive electrodes and the electrodes 60 and 63 are formed into negative electrodes (earthing electrodes). This film is bonded to a supporting plate same as used in Example 1, and when the resulting assembly is actuated by a hammering mechanism as described in Example 1, output voltages of the same polarity (positive voltages of 4 V) are obtained from the electrodes in the directions X and Y, and these outputs can easily be processed by amplifiers connected to a single power source.

EXAMPLE 3

Figure 8:
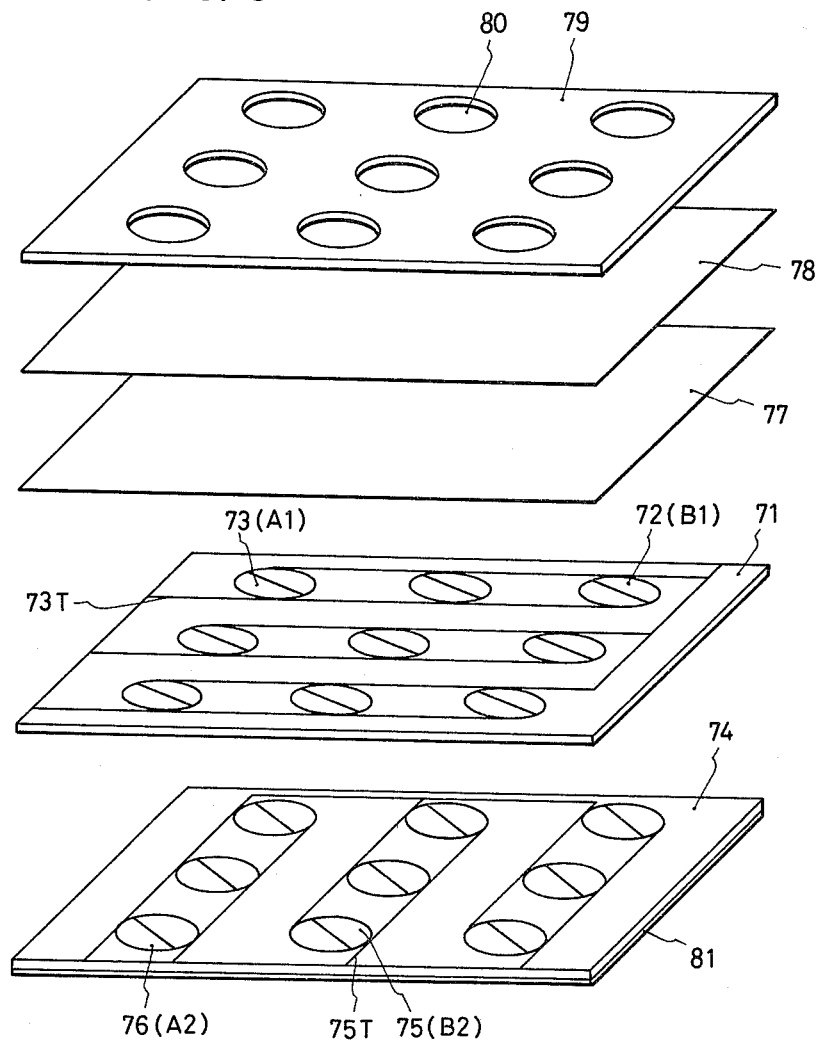
FIG. 8 is a fragmentary perspective view illustrating still another embodiment of the input element according to the present invention.

Nylon 11 is kneaded under heating with PZT ferroelectric fine particles (having a particle size not exceeding 5 μm), and the kneaded mixture is sheeted by means of a hot roller to form a film 71 having a thickness of 150 μm and containing the ferroelectric particles in an amount of 35% by volume. As shown in FIG. 8, an electrode pattern of second signal-detecting electrodes 75 (B2) in the direction X and back-face earthing electrodes 76 (A2), similar to the electrode pattern of Example 1, is formed on a supporting plate 74 by the etching method. A shielding copper foil 81 is formed on the lower surface of the supporting plate 74, and the above-mentioned film 71 is bonded by an adhesive to the upper surface of the supporting plate 74 first signal-detecting electrodes 73 (A1) in the direction Y and front-face earthing electrodes 72 (B1) are formed on the upper surface of the film 71 by screen printing, so that 10×10 coordinate input points are formed on an area of 10×10 cm². Poling is carried out by applying voltages of reverse polarities between the electrodes in the direction X and the earthing electrodes and between the electrodes in the direction Y and the earthing electrodes, respectively, as in Example 2, whereby the electrodes 73 and 75 are formed into positive voltage electrodes and the electrodes 72 and 76 are formed into earthing electrodes. Then, as shown in FIG. 8, a silicone rubber sheet 77 having a thickness of 1 mm, a shielding aluminum foil 78 and a plastic plate 79 having key holes 80 corresponding to the electrode portions are piled in sequence.

When the input element having the above-mentioned structure is actuated by the hammering mechanism as shown in FIG. 6-(a) or 6-(b), outputs of the same polarity (positive) in the directions X and Y, which are free of noise and cross-talk, are obtained from signal output terminals 73T and 75T of the electrodes 73 and 75.

Figure 9:
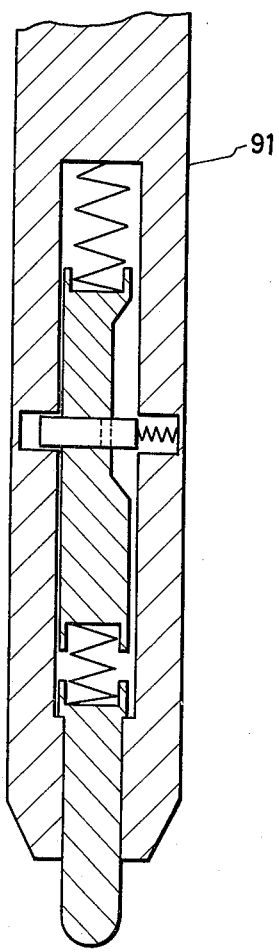
FIG. 9 is a diagram illustrating still another instance of the hammering mechanism.

In the foregoing embodiments, hammering of the coordinate input device is performed by the hammering mechanism as shown in FIG. 6-(a) or 6-(b). In case of an input element of a higher density, there may be adopted a pencil-type hammering mechanism 91 as shown in FIG. 9 to impart dynamic stimula.

Furthermore, a dynamic stimulus input pen arranged so as to generate sonic vibrations by a piezoelectric or magnetrostriction vibrator or by a discharge element may be used in the present invention.

Figure 10:
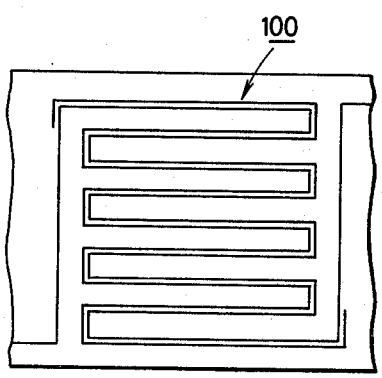
FIG. 10 is a partial plan view showing the electrode structure in still another embodiment of the input element according to the present invention.

The shape of the electrode corresponding to one stimulus-receiving portion at an input portion or a key is not particularly critical in the present invention, but for example, a comb-shaped electrode 100 as shown in FIG. 10 may be used so that the outputs in the directions X and Y are not substantially changed according to the change of the position to which a dynamic stimulus is given.

As illustrated in Example 3, a non-rigid insulating or conductive film may be formed on the upper or lower surface of the piezoelectric film for electrostatic shielding or protection.

Moreover, the holes of the supporting plate as used in Example 1 or 2 may be filled with a rubbery elastomer to support the piezoelectric film. In this embodiment, the piezoelectric output by elongation or contraction in the thickness direction can be utilized, and by virtue of the presence of the rubbery elastomer, generation of bouncing output signals can be controlled.

In the foregoing embodiments, pressure-sensitive portions are formed entirely or partially on the surface of one continuous polymeric film. For saving the piezoelectric material, it is possible to adopt an embodiment where pieces having a size corresponding to the size of the portions to which a mechanical stimulus is to be applied are cut from a polymeric piezoelectric material and they are bonded to other sheet-like material to form substantially one film. Of course, this embodiment is included in the scope of the present invention.

In the foregoing embodiments, dynamic stimula are applied to the polymeric film to obtain necessary outputs. It is known that polymeric piezoelectric materials, especially those of the above-mentioned types (2) and (3), have a pyroelectric characteristic, and when thermal stimula are applied to these polymeric material films, voltages or charges are similarly generated as in the case where dynamic stimula are given. Accordingly, an embodiment in which an input pen for generating a thermal stimulus or a thermal input mechanism is used for input of coordinate or key signals is included in the scope of the present invention.

As will be apparent from the foregoing illustration, according to the present invention, good output signals free of cross-talk or noise can be taken out without damaging inherent characteristics of a polymeric piezoelectric material or without formation or particular through holes. Furthermore, an excellent input element which can readily be processed can be provided according to the present invention, and this excellent input element of the present invention can be advantageously applied to various uses, for example, for the manufacture of a coordinate input device, a keyboard, a position detecting device and the like.

What is claimed is:

1. An input element for use as a transducer in keyboard comprising:
    a supporting plate,
    a plurality of stimulus-receiving portions provided on said supporting plate,
    a first signal-detecting electrode (A1) and a front-face earthing electrode (B1) provided mutually independently on the front face of each of said stimulus-receiving portions,
    a back-face earthing electrode (A2) and a second signal-detecting electrode (B2) provided mutually independently on the back face of each of said stimulus-receiving portions,
    said first signal-detecting electrode (A1) being disposed corresponding to said back-face earthing electrode (A2),
    said second signal-detecting electrode (B2) being disposed corresponding to said front-face earthing electrode (B1),
    a portion (CA) of each of said stimulus-receiving portions located between said first signal-detecting electrode (A1) and said back-face earthing electrode (A2) being formed from polymeric material having piezoelectric or pyroelectric property, and
    a portion (CB) of each of said stimulus-receiving portions located between said second signal-detecting electrode (B2) and said front-face earthing electrode (B1) being formed from polymeric material having piezoelectric or pyroelectric property.

2. The input element of claim 1 wherein a polarity of said portion (CA) and a polarity of said portion (CB) are the same polarity.

3. The input element of claim 1 wherein a polarity of said portion (CA) and a polarity of said portion (CB) are the reverse polarity.

4. The input element of claim 1 wherein said plurality of stimulus-receiving portions are provided on a same continuous polymeric film.

5. The input element of claim 4 wherein said continuous polymeric film has piezoelectric or pyroelectric property throughout the film.

6. The input element of claim 4 wherein said continuous polymeric film has piezoelectric or pyroelectric property only at said stimulus-receiving portions.

7. The input element according to claim 1 further comprising a plurality of lead wires (A) and plurality of lead wires (B), each of said lead wires (A) is connected to a plurality of said first signal-detecting elestrodes (A1) and each of said lead wires (B) is connected to a plurality of said second signal-detecting electrode (B2).

* * * * *